(12) United States Patent
Farassat

(10) Patent No.: US 6,891,730 B2
(45) Date of Patent: May 10, 2005

(54) CIRCUIT HOUSING

(75) Inventor: Farhad Farassat, Taufkirchen (DE)

(73) Assignee: F & K Delvotec Bondtechnik GmbH, Ottobrumm (DE)

( * ) Notice: Subject to any disclaimer, the term of this patent is extended or adjusted under 35 U.S.C. 154(b) by 34 days.

(21) Appl. No.: 10/008,780

(22) Filed: Nov. 13, 2001

(65) Prior Publication Data

US 2003/0007334 A1 Jan. 9, 2003

(30) Foreign Application Priority Data

Jun. 28, 2001 (EP) .............................................. 01115832

(51) Int. Cl.[7] .............................. H05K 7/10; H05K 7/12
(52) U.S. Cl. ........................ 361/769; 361/728; 361/752; 361/760; 361/767; 257/704; 257/726
(58) Field of Search ................................. 361/728, 736, 361/742, 748, 752, 758, 760, 767, 769, 770, 772, 783, 667–671, 704, 717–720; 257/704, 726, 727, 719, 723, 724, 659, 660, 728, 737, 738, 778; 165/80.3, 185; 439/331, 73, 71; 324/765; 438/108

(56) References Cited

U.S. PATENT DOCUMENTS

| | | | | |
|---|---|---|---|---|
| 2,780,758 A | * | 2/1957 | Zetwo | ........................ 257/658 |
| 3,299,328 A | * | 1/1967 | Martin et al. | ............... 257/727 |
| 3,654,529 A | * | 4/1972 | Lord | ........................... 257/689 |
| 3,912,525 A | * | 10/1975 | Monneraye et al. | ........... 501/79 |
| 4,415,025 A | * | 11/1983 | Horvath | ....................... 165/185 |
| 4,748,495 A | * | 5/1988 | Kucharek | ................... 257/713 |
| 5,616,520 A | * | 4/1997 | Nishiuma et al. | ........... 438/125 |
| 5,949,654 A | * | 9/1999 | Fukuoka | ...................... 361/760 |
| 6,020,597 A | * | 2/2000 | Kwak | .......................... 257/48 |
| 6,165,816 A | * | 12/2000 | Mizushima et al. | ......... 438/118 |

FOREIGN PATENT DOCUMENTS

| | | | |
|---|---|---|---|
| GB | 980558 | * | 1/1965 |
| GB | 1 246 858 | * | 9/1971 |
| JP | 11-185915 | * | 7/1999 |

* cited by examiner

Primary Examiner—Phuong T. Vu
(74) Attorney, Agent, or Firm—Knobbe, Martens, Olson & Bear, LLP

(57) ABSTRACT

Miniaturized circuit housing to encapsulate and provide external contacts for at least one integrated circuit, in particular of the flip-chip or wafer-level-package type, with a housing floor, the lower surface of which bears housing contact elements for making external contact and the upper surface of which is electrically connected to circuit contact elements on the lower surface of the circuit, wherein a housing lid is provided, in particular opposite the housing floor, which presses the circuit with the circuit contact element resiliently against the upper surface of the housing floor, and between the circuit contact elements and the housing floor there is no connection that fixes their materials permanently together.

25 Claims, 3 Drawing Sheets

CIRCUIT HOUSING

Related Applications This application claims the benefit of the application 01 115 832.6 filed in the European Patent Office Jun. 28, 2001.

BACKGROUND OF THE INVENTION

1. Field of the Invention

The invention relates to a miniaturized circuit housing for encapsulating and providing external contacts for integrated circuits and, in particular, a housing with a housing floor and an oppositely disposed housing lid which presses a circuit contact element positioned therebetween resiliently against the upper surface of the housing floor.

2. Description of the Related Art

Integrated circuits (chips) employed in electronic devices are almost always mounted in housings. These housings protect the sensitive semiconductor structures from harmful environmental influences such as moisture, light, dust and mechanical forces. In many cases enclosure in a housing simultaneously serves to adapt the structural widths and distances customary in LSI and VLSI technology to the—sometimes substantially larger—structural dimensions of printed circuits.

The physical properties of their housings influence the electrical behaviour and the reliability of chips to a considerable degree, and the technique of constructing housings and installing circuits in them is a substantial aspect of the overall process of manufacturing semiconductor components, which contributes appreciably to the final performance parameters and costs.

During the development of semiconductor technology, different types of housing were designed, with countless variants. From the viewpoint of mounting on a circuit board, a distinction is made in particular between plug-in and surface-mounted housings; and with regard to the connection of the chip to the external connectors of the housing, the distinction is especially between the wire-bonding and flip-chip methods.

In the course of the continually progressing miniaturization of extremely powerful electronic devices and their components, for several years miniaturized circuit housings have been constructed, the dimensions of which are only negligibly larger than those of the chips installed in the housing, and which therefore are generally designated chip-scale packages (CSP). Appreciable shares of the market have also already been gained by housings designed to be installed directly on the—still undivided—wafer, which thus are called wafer-level packages (WLP). In this case the connections are customarily made by a modified flip-chip method, in which the contact surfaces of the flip on one hand and of the housing or board on the other (the so-called pads) are connected to one another in a wireless manner, by way of soldered points (known as "bumps" or, because they usually have a nearly spherical shape, as "solder balls").

The above-mentioned miniaturized housings, in particular the WLPs, have already been used for a considerable number of different products, in particular for serial EEPROMs, flash memory and integrated passive component configurations (IPDs), as well as analog HF and power circuitry. A beginning has also been made in packaging DRAMs with these techniques. Hence the term "circuit" in the following should be understood to mean any kind of integrated electronic component configuration that can be provided with a miniaturized housing of the kind mentioned above.

The housings of interest here are made substantially of plastic or ceramic and as a rule are hermetically sealed. Ceramic housings, after chip attachment and connection have been completed, are closed with a ceramic lid (which is pressed on) or a metal lid (which is soldered into place), and a sealing glass is used to create a tight join between lid and housing wall. To finish off a plastic housing, the still-connected chip carriers (lead frames), on which as many as 100 circuits are disposed in strips, are coated at high temperature with epoxy resin that has been loaded with minerals.

The combination in an extremely small space of such diverse materials, with widely differing thermal expansion coefficients, produces various problems with respect to reliability. Particularly stubborn problems have proved to be caused by cracks and fractures in the solder connections between the contact surfaces of chips and housing—that is, the above-mentioned bumps. Attempts have been made to increase their mechanical stability by surrounding them with a polymer "collar", which is an extremely elaborate technical procedure. These and similar developments, however, have not been altogether successful. Furthermore, the chips themselves have proved to be at risk of breaking; in particular, microcracks have considerably endangered their long-term reliability.

The objective of the invention is thus to disclose an improved circuit housing of this generic kind that provides a substantial increase in reliability of the chip-housing unit without a serious increase in costs.

SUMMARY OF THE INVENTION

This objective is achieved by a miniaturized circuit housing with the characteristics of claim 1.

The invention is based on the inventor's recognition of a crucial fact concerning the reliability problems of the known miniaturized circuit housings, in particular those of the flip-chip or WLP type, which have not been solved despite years of discussion in the literature and various previous proposals for solution. That is, these problems are basically brought about by the difficulty of producing a rigid, permanent connection between materials having very different thermal expansion coefficients. The solution proposed here incorporates the idea of a fundamental departure from the connection method that has previously been almost universally used, namely soldering.

Finally, the invention encompasses the idea of producing a sufficiently low transition resistance between chip contact elements and housing contact surfaces by applying an elastic pressure between the two, with a pressing force that is sufficient while being calibrated to suit the specific construction (shape and material) of the chip contact elements. (This principle is of course also implemented in a variant in which the contact elements are in the housing and the contact surfaces in electrical contact therewith are situated on the chip.)

The term "contact surfaces" in the context of the invention is understood to mean both genuine surface contact sites (pads) and also—in an embodiment that may even be preferred—low, flat elevations made of a well-conducting and corrosion-resistant material, in particular gold. Slight elevations of this kind can in particular be formed by stamping ("flattening") small gold spheres similar to the customary bumps. This embodiment ensures a higher reliability of contacting the chip within the housing, with respect to higher tolerances of the bump configuration or of slight curvatures or distortions of the housing or chip surfaces.

A substantial advantage of the solution proposed here is that the chip does not need to be soldered to the housing, or eutectically connected to its contact surfaces or elements, which eliminates a technologically elaborate processing step. Because the materials of chip and housing are not fixedly (and hence rigidly) joined together, the present quality problems resulting from different thermal expansion coefficients no longer arise, for practical purposes. Furthermore, the housing can be tested immediately (and closed or finished only after the test has been passed), and repairs can be carried out in a cost-effective manner, without discarding the expensive chip.

In a first preferred embodiment the lid of the chip housing comprises on its undersurface, which faces the chip, at least one spring element that presses the chip against the floor of the housing. This is preferably firmly attached to the undersurface of the housing lid, but in an alternative embodiment there is provided at least one spring element that is inserted loosely between housing lid and chip; and finally, the spring element can in principle also be attached (for example, glued) to the surface of the chip.

The spring element is constructed, for example, as a springy metal strip resembling a contact or leaf spring, resilient metal ring or bent wire; comparable geometric shapes can also be made of plastic. In addition, it is possible to use elastomer foam elements, manufactured separately from the lid.

In another embodiment the housing lid itself is designed to produce the elastic pressing force for the chip; for example, it can be shaped so as to be resilient as a whole, or to be compressible or at least to have compressible regions (for instance, made of elastomer foam).

In another preferred embodiment the proposed housing has a wall that substantially rigidly connects the circumference of the housing floor to the housing lid (when the housing is in the finished state), and tightly seals off the interior of the housing. The wall can be formed together—in particular integrally—with either the floor or the lid of the housing, in which case it is preferably sealed in a gas-tight manner to the respective other housing component. In a modified embodiment it is also possible to construct the housing lid with a curvature such that it incorporates a circumferential wall indistinguishable from the lid itself.

The sealing between the wall and the floor or lid of the housing (or, in the last-mentioned variant, directly between floor and lid) can be provided by an external plastic encapsulation of at least the butt joint between the adjacent parts, or in any case can at least include such a plastic encapsulation. In the case of ceramic housings the sealing mechanism can also (in a manner known per se) be formed by a sealing glass.

The above-mentioned gas-tight seal advantageously enables the interior of the housing to be permanently filled with a medium that is slow to react, in particular an inert gas, which reliably prevents any corrosive processes from operating inside the housing.

From the present viewpoint the shape of the housing proposed here preferably resembles the customary configuration, being a low, four-cornered structure with substantially flat and rectangular floor and lid. With the curved lid design mentioned above, for example, a housing with the shape of a shallow section of a cylinder, sphere or barrel would result. It should be understood, however, that housings of other shapes are also within the scope of the invention.

To prevent forces of external origin being transmitted to the chip, the lid of the housing is preferably rigidly constructed and, where appropriate, is connected to the wall in such a way that external forces are reliably absorbed. The same function can be served by a protective roofing structure that provides a rigid covering (for example, is made of a hardened, loaded artificial resin).

In another preferred embodiment the housing lid is constructed as a heat sink to cool the circuit, for which purpose it comprises in particular cooling ribs or similar area-enlarging structures. In this embodiment it is preferred for the lid itself, as well as the spring element or elements, to be made of a material with good thermal conductivity, in order to ensure an efficient transfer of heat from the chip to the cooling ribs or the like.

The floor of the housing, in a design particularly appropriate for miniaturized electronic devices, can be constructed so as simultaneously to serve as the device's circuit board or a section thereof.

The contact elements of the housing, in a first advantageous embodiment designed for the modern mounting technologies of electronic devices, are fundamentally elements ("bumps") shaped like spheres or sections of a sphere, in the nature of solder balls. In another embodiment the contact elements of the housing are constructed in a rod-like shape, and in yet another embodiment as flat contact surfaces. The particular design for a specific case will depend on the design principles and installation procedures that apply to the device in which the proposed housing is to be employed.

With respect to the above-mentioned matching of material and shape of the chip contact elements to the elastic pressing force of the lid, particularly suitable materials for the chip contact elements are gold or a gold alloy that is not too hard; however, it is also possible to use other noble metals with hardness and flow properties suitable for the long-term requirements of the particular application.

Brief Description of the Drawings

Other advantages and useful aspects of the invention will be apparent from the subordinate claims and from the following description of exemplary embodiments with reference to the attached drawings, wherein

DETAILED DESCRIPTION OF THE PREFERRED EMBODIMENTS

Figure 1A:
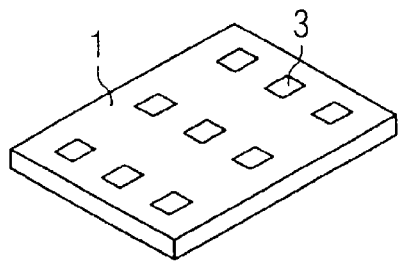
FIGS. 1A to 1C are schematic drawings of a semiconductor chip to be encapsulated in a housing in accordance with the invention, shown in perspective (FIGS. 1A and 1B) and in cross section (FIG. 1)

FIGS. 1A to 4 show—in rough schematic drawings—a semiconductor chip 1 with metallic contact surfaces 3 and gold contact elements (bumps) 5, which is to be encapsulated in a miniaturized chip housing 7. The shape of the latter corresponds to the basic rectangular form of the chip, in that it has a rectangular housing floor 9 with integral low wall 11, on the inner surface of which metallic contact surfaces 13 are likewise provided and which has on its under (outer) surface soldered contact elements (solder balls) 15 or—in the modified embodiment according to FIG. 2C—contact pins 15' as housing contact elements. (Because in the embodiment according to FIG. 2C the housing floor is of course correspondingly modified, there it is identified by the reference numeral 9'.) The housing 7 further comprises a lid 17, a flat rectangular structure of the same shape as the floor 9, which in its middle region bears two metallic spring elements (leaf springs) 19 on its lower surface and cooling ribs 21 on its upper surface.

Figure 4:
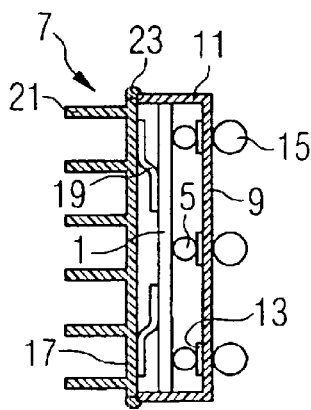
FIG. 4 is a schematic cross-sectional view of a circuit housing composed of a semiconductor chip according to FIGS. 1A to 1C, a floor-wall part according to FIGS. 2A and 2B, and a housing lid according to FIGS. 3A and 3B, FIGS. 5A to 5C are drawings of the parts of another circuit-housing design, in cross section and side view, respectively.

In FIG. 4 the housing 7 is shown in the assembled state. It can be seen that the chip 1 is set onto the housing floor 9 with its circumferential wall 11 in such a way that the bumps 5 rest against the inner surface of the housing floor (specifically, on the contact surfaces 13 there). Above the chip 1 the housing lid 17 has been put on in such a way that the spring elements 19 are turned towards the upper surface of the chip and flexibly press against it; this pressure is transmitted to the bumps 5 and press them against the contact surfaces on the housing floor 9. The metallic spring elements 19 also serve to transmit heat from the chip to the housing lid 17, from which it passes to the cooling ribs 21, which in this embodiment—just like the lid 17 itself—are made of a material with good thermal conductivity.

The interior of the housing is preferably filled with an inert gas (in particular argon or nitrogen), which can relatively easily be achieved by assembling the housing in an inert-gas atmosphere. Finally, the butt join between the circumferential edge of the housing lid 17 and the circumferential edge of the wall 11 is hermetically sealed with a sealing material 23 (sealing glass, synthetic-resin adhesive or the like) selected for compatibility with the housing material.

Figure 1B:
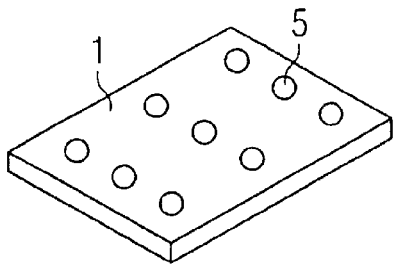
Figure 1C:
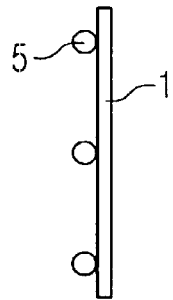
Figure 2A:
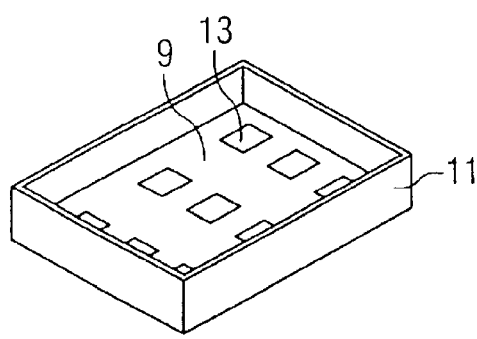
FIGS. 2A to 2C are schematic drawings of a first part of a circuit housing comprising a floor and a wall formed as a part thereof, shown in perspective (FIG. 2A) and in side view (FIG. 2B) in a first embodiment, as well as a cross-sectional view of a second embodiment (FIG. 2C)
Figure 2B:
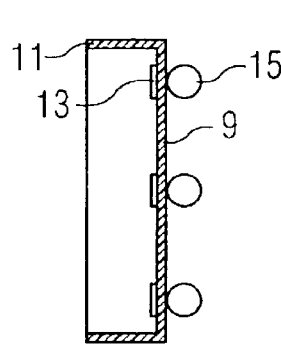
Figure 2C:
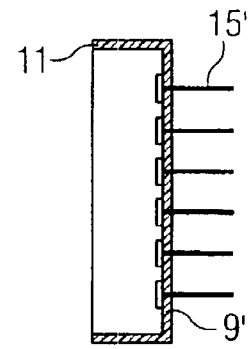
Figure 3A:
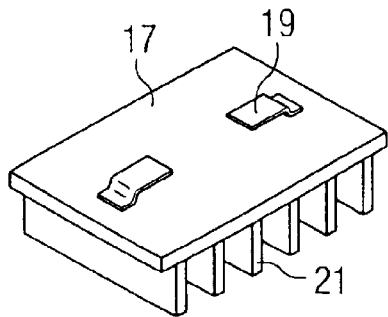
FIGS. 3A and 3B are schematic drawings of a housing lid, as the second part of a circuit housing, shown in perspective and in side view respectively.
Figure 3B:
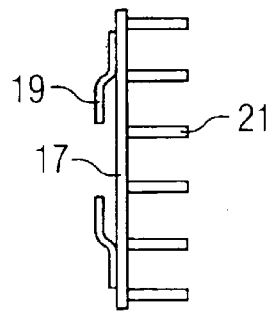
Figure 5A:
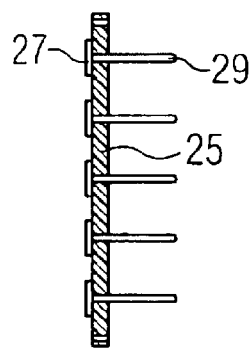
Figure 5B:
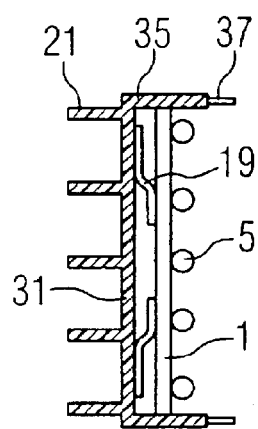
Figure 5C:
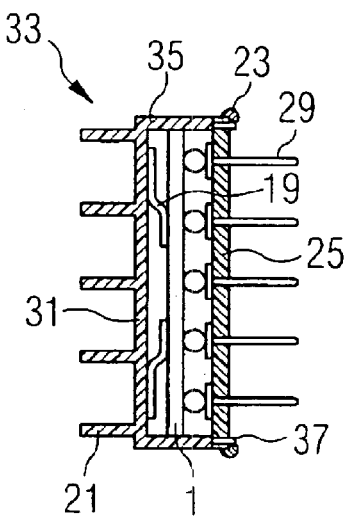

In FIGS. 5A to 5C another embodiment is sketched, in which the chip 1 shown in FIGS. 1A to 1C is enclosed in a housing, the floor of which is formed by a board 25 with contact surfaces 27 and contact pins 29 connected thereto for making contact with external devices. To form a chip housing 33, this board 25 is combined with a modified housing lid 31 that has an integrally formed wall 35 bearing centring pins 37 to centre the housing lid and inserted chip with respect to the board. (The parts not named here are the same as in the preceding embodiment and are labelled with the same reference numerals as in FIGS. 1A to 4.)

Figure 6:
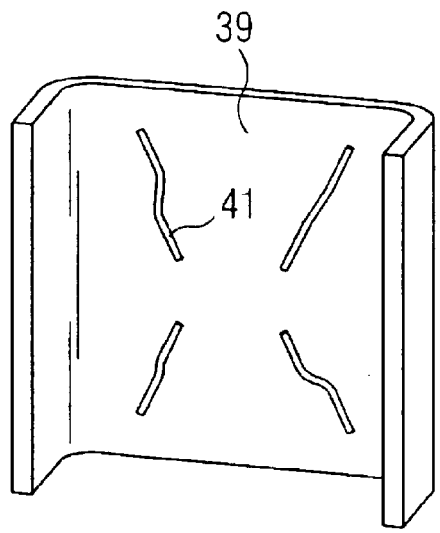
FIGS. 6 and 7 are sketches of the housing lid and spring elements according to other embodiments of the invention and FIG. 8 is a schematic perspective drawing of an entire arrangement of circuit housing and IC according to another embodiment.
Figure 7:
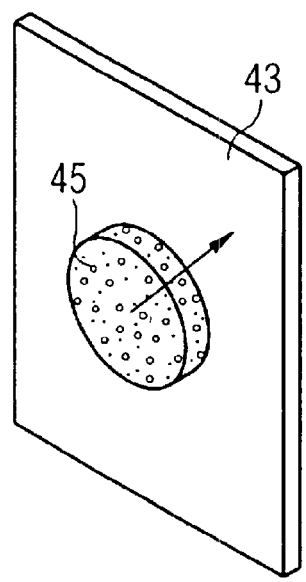

FIGS. 6 and 7 show in perspective two other embodiments of housing lid and spring element(s) for encapsulating a chip while simultaneously flexibly pressing its contact elements against a housing floor. The housing lid 39 in FIG. 6 has the basic shape of a "U", on the underside of which four bent spring wires 41 are disposed (e.g., glued or soldered on) to serve as contact elements; these have an action similar to that of the leaf springs 19 in the first embodiment.

In the embodiment according to FIG. 7 the housing lid 43 is simply a rectangular plate, below which a spring element 45 is inserted when the lid is pressed onto the lower part (floor and wall) of the housing, as symbolized by the arrow in the figure. This spring element 45 is elliptical in cross section and is separately manufactured from an elastomer foam.

Figure 8:
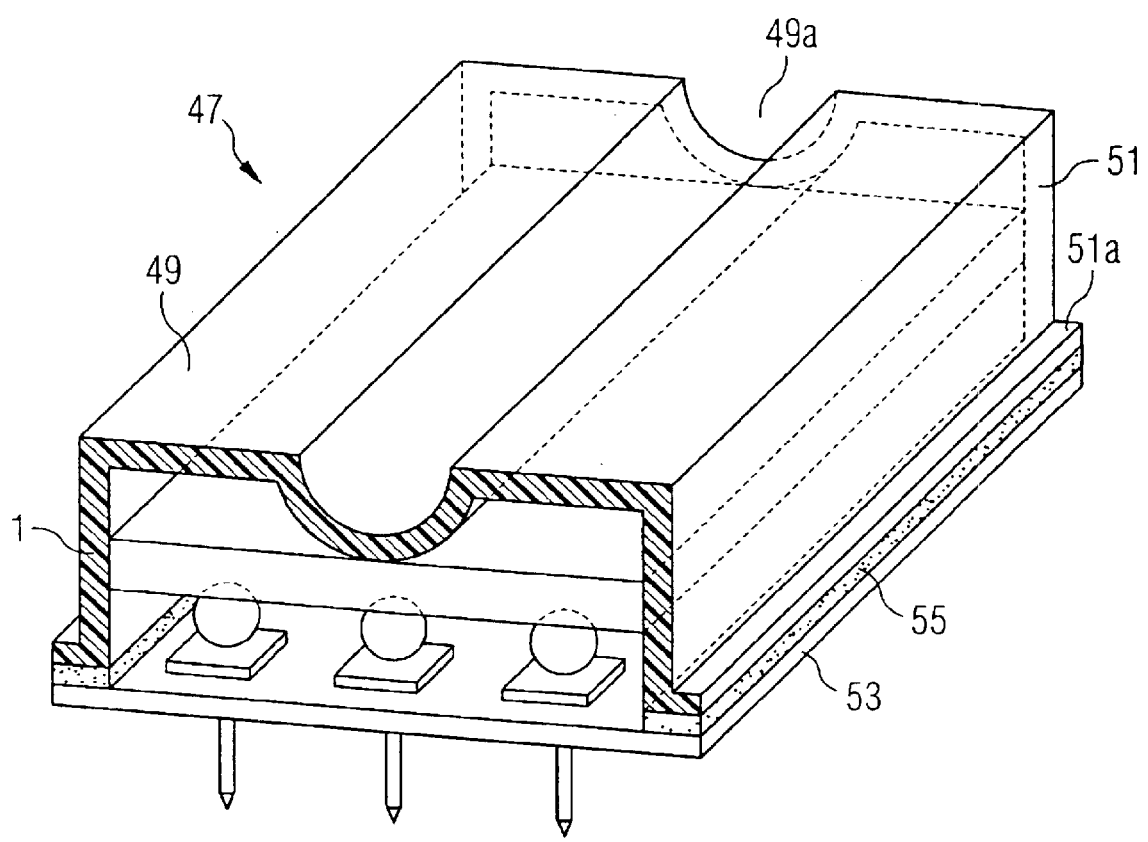

In FIG. 8, finally, is sketched an external view of a chip housing 47 which, like the housings according to FIGS. 4 and 5C, has the basic shape of a nearly flat rectangle. Its plastic housing lid 49 with integrally formed wall 51 and mounting flange 51a has a middle region 49a that curves inward in the form of a half cylinder. The thickness of the lid in this middle region 49a is less than in the rest of the lid 49; the middle region therefore has a degree of elasticity and presses on the upper surface of the inserted chip so as to force the chip elastically against the inner surface of the housing floor 53. Between the mounting flange 51a and the housing floor 50 there is a circumferential seal 55 made of a quick-setting adhesive.

A housing lid that is springy in itself can also be constructed in many other ways, for instance as a curved sheet of spring steel. In the case of such embodiments, normally an additional protective lid (e.g., made of plastic) is provided to prevent damage to the chip when external forces are acting on the housing.

Implementation of the invention is not limited to the examples described above or to the aspects emphasized there, but is likewise possible in a large number of modifications which—in adaptation to the specific details of the assembly method and housing material to be used, and to a predetermined basic housing shape—are left to the expert's discretion.

List of reference numerals

| | |
|---|---|
| 1 | Semiconductor ring |
| 3; 13; 27 | Contact surface |
| 5 | Gold contact element (bump) |
| 7; 33; 47 | Chip housing |
| 9; 9'; 53 | Floor of housing |
| 11; 35; 51 | Wall |
| 15 | Soldered contact element (solder ball) |
| 15'; 29 | Contact pin |
| 17; 31; 39; 43; 49 | Lid of housing |
| 19 | Spring element (leaf spring) |
| 21 | Cooling rib |
| 23; 55 | Seal |
| 25 | Board |
| 37 | Centring pins |
| 41 | Spring wire |
| 45 | Elastomer-foam spring element |
| 51a | Mounting flange |

What is claimed is:

1. A miniaturized circuit housing to encapsulate and provide external contacts for at least one integrated circuit having circuit contacts, the circuit housing comprising:
   a housing floor comprising a lower surface which includes housing contact elements for making external contact and an upper surface with contact surfaces arranged to correspond to the circuit contacts and the housing floor being configured to receive at least one integrated circuit; and
   a housing lid permanently attached to the housing floor so as to define the housing and the housing lid comprising at least one spring element fixedly attached to a lower surface of the housing lid such that, when at least one integrated circuit is positioned within the housing, the at least one spring element bears directly on the at least one integrated circuit so as to press the at least one integrated circuit resiliently against the upper surface of the housing floor with no permanent connection between the contact surfaces of the housing and the at least one integrated circuit.

2. The circuit housing of claim 1, wherein the at least one spring element is loosely inserted between the housing lid and circuit.

3. The circuit housing of claim 1, wherein the housing lid is flexible.

4. The circuit housing of claim 1, further comprising a wall that substantially rigidly connects the floor and the lid of the housing to one another at their circumference so as to define an interior of the housing and tightly seals off the interior of the housing when the housing floor and lid are attached.

5. The circuit housing of claim 4, wherein the wall is formed as part of the housing floor or the housing lid and wherein the wall is sealable via a butt joint to the respective housing lid or housing floor in a gas-tight manner.

6. The circuit housing of claim 5, wherein the seal is formed by an external plastic encapsulation of at least the butt joint between the housing lid or housing floor and the wall.

7. The circuit housing of claim 4, wherein the interior of the housing is filled with an inert gas when sealed.

8. The circuit housing of claim 1, wherein the housing has a flat four-cornered shape, with a substantially level and rectangular housing floor and housing lid.

9. The circuit housing of claim 4, wherein the lid of the housing is rigidly constructed and joined to the wall.

10. The circuit housing of claim 1, wherein the lid of the housing is constructed as a heat sink comprising area-increasing structures in order to cool the circuit.

11. The circuit housing of claim 1, wherein the ductility and shapes of the housing lid and the at least one spring element is selected such that the pressing force exerted by the housing lid and the at least one spring element between the circuit and the housing floor is such as to maintain electrical contact between the circuit contact elements and the housing floor.

12. The circuit housing of claim 1, wherein the housing contact elements are at least partially spherical.

13. The circuit housing of claim 1, wherein the housing contact elements are constructed substantially as contact pins or flat contact surfaces.

14. The circuit housing of claim 1, wherein the housing floor is constructed as at least a section of a circuit board.

15. The circuit housing of claim 1, wherein the contact surfaces are configured as flat elevations so as to make internal contact with the circuit contact.

16. The circuit housing of claim 15, wherein the contact surfaces comprise gold and are formed by the stamping of bumps.

17. The circuit housing of claim 4, further comprising a rigid covering wherein the rigid covering shields the lid of the housing such that externally applied forces are inhibited from being transmitted to the circuit.

18. An electronic circuit housing assembly comprising:
a circuit chip having chip contacts;
a housing floor comprising a plurality of outer contacts disposed on a lower surface of the housing floor so as to provide external contact and which are in electrical contact with a corresponding plurality of inner contacts arranged to correspond to the chip contacts; and
a housing lid comprising one or more resilient elements and permanently attachable to the housing floor so as to define a housing wherein positioning of the chip within the housing and attachment of the housing lid to the housing floor induces the one or more resilient elements to bear directly on the circuit chip so as to induce an elastic pressure on the chip so as to create solely a compression contact between the chip contacts and the inner contacts.

19. The circuit housing of claim 18, wherein the elastic pressure arises from an elastic deformation of the housing lid upon attachment of the housing lid and the housing floor with the chip interposed therebetween.

20. The circuit housing of claim 18, further comprising at least one elastic element interposed between the housing lid and the chip.

21. The circuit housing of claim 20, wherein the at least one elastic element comprises a spring.

22. The circuit housing of claim 20, wherein the at least one elastic element comprises an elastomeric bulk material.

23. The circuit housing of claim 20, wherein the at least one elastic element is fixedly attached to the housing lid or the chip.

24. The circuit housing of claim 20, wherein the at least one elastic element is held in compression between the housing lid and the chip by the attachment of the housing lid to the housing floor.

25. The circuit housing of claim 18, wherein at least one of the outer contacts and the chip contacts comprise gold.

* * * * *

UNITED STATES PATENT AND TRADEMARK OFFICE
CERTIFICATE OF CORRECTION

PATENT NO. : 6,891,730 B2
DATED : May 10, 2005
INVENTOR(S) : Farhad Farassat

It is certified that error appears in the above-identified patent and that said Letters Patent is hereby corrected as shown below:

<u>Title page,</u>
Item [73], Assignee, address change "Ottobrumm (DE)" to -- Ottobrunn (DE) --

Signed and Sealed this

Ninth Day of August, 2005

JON W. DUDAS
*Director of the United States Patent and Trademark Office*